United States Patent [19]

Clark et al.

[11] Patent Number: 4,658,326
[45] Date of Patent: Apr. 14, 1987

[54] HOSE COUPLING

[75] Inventors: Paul W. Clark; John S. Gulliford, both of San Francisco, Calif.

[73] Assignee: Clemco Industries, San Francisco, Calif.

[21] Appl. No.: 285,968

[22] Filed: Jul. 23, 1981

[51] Int. Cl.[4] .............................................. H01G 1/08
[52] U.S. Cl. .............................. 361/215; 174/35 GC; 277/235 R; 285/79; 285/82; 285/238; 285/423; 285/910
[58] Field of Search .................... 285/82, 238, 79, 423, 285/352; 277/235 R, DIG. 6; 174/35 GC; 361/215

[56] References Cited

U.S. PATENT DOCUMENTS

| 1,914,368 | 6/1933 | Goodhall |  |
|---|---|---|---|
| 2,132,506 | 10/1938 | Allen | 285/67 |
| 2,245,101 | 6/1941 | Cole | 285/238 X |
| 2,816,779 | 12/1957 | Jensen | 285/74 |
| 3,498,641 | 3/1970 | Bohlen | 285/84 |
| 3,758,137 | 9/1973 | Kershaw | 285/70 |
| 3,783,173 | 1/1974 | Twomey | 277/235 R X |
| 3,831,984 | 8/1974 | Kutina et al. | 285/73 |

*Primary Examiner*—Dave W. Arola
*Attorney, Agent, or Firm*—Malcolm B. Wittenberg

[57] ABSTRACT

The present invention relates to a high impact hose coupling having a hollow body constructed of plastic, a helical restriction means to hold the hose end within the coupling body, a double locking means for locking coupling halves together, and a static electric conducting gasket to allow the conduction of static electricity within the coupling.

7 Claims, 4 Drawing Figures

HOSE COUPLING

BACKGROUND

In the past, there have been various types of high impact hose couplings used in sandblasting and the like. These couplings consisted of two coupling halves usually constructed of some type of metal. All hose couplings had some type of locking mechanism to lock the coupling halves together and, in some instances, a second locking means to prevent the coupling halves from rotating out of a locked relationship, where the primary locking mechanism consisted of rotating the coupling halves into a locking relationship. For example, U.S. Pat. Nos. 2,132,506 and 3,498,641 show hose couplings with a primary locking mechanism for the coupling and a spring wire locking mechanism to prevent the coupling halves from rotating out of their locked position. Another prior art patent, U.S. Pat. No. 1,914,368, shows a primary locking mechanism and a second method of preventing rotation of coupling halves out of their locked relationship.

To ensure that there was not any leakage at the point of union of the coupling halves, the prior art disclosed various gaskets and gasket configurations disposed at the union. Prior art gasket configurations are represented in U.S. Pat. Nos. 2,816,779, 3,758,137 and 3,831,984.

The prior art relating to hose couplings has additionally been concerned with methods of attaching the hose to a respective coupling half. The connections for the hose have been represented in many cases by frusto-conical coupling sections, which receive the hose on the outside of that section, as is shown in U.S. Pat. Nos. 1,914,368, 3,498,641, 3,758,137 and 3,831,984. There are other methods of attaching a hose to a coupling half, such as that requiring a special end piece to mate with the internal threading of the hose coupling as represented by U.S. Pat. No. 2,816,779.

A major problem in sandblasting in the past has been the build-up of static electricity in the hose due to the rapid flow of sand in the hose and in the coupling. The hose had to be grounded to prevent shock or arcing at the couplings. As static electricity built up, the flow of static electricity would be from the nozzle to the adjacent hose section, to the coupling, to the next hose section and so on until contact with ground was established. The ground could be established at the sand source or at intermediate places along the hose. If the hose was not grounded, the static electricity could build up in the hose to a point where there was electric shock and/or arcing at the coupling causing personal injury or damage.

In situations where non-metallic couplings were used, the concern over the static electricity flow became more acute. When there were metallic couplings there could be a continuous flow of the static electricity to ground. However, when there were non-metallic couplings, there could not be a continuous flow through the coupling itself, and the gasket material would serve as an insulating barrier between the coupling halves. The result would be a static electric build-up in the separate hose sections that could cause damage to the hose.

The use of a non-metallic coupling was considered highly desirable in the past because there was never a danger of arcing at the coupling when in close proximity to a metallic object. This feature was attractive when sandblasting operations were being conducted in an area where there were flammable gases present. However, there still existed the problem of how to dissipate the static electric build-up in the hose sections when non-metallic couplings were used due to the insulating features of the coupling itself and the gasket.

The present invention overcomes the problems inherent in the use of the non-metallic couplings of the past.

An object of the invention is to provide an improved non-metallic hose coupling.

Another object of the invention is to provide an improved hose coupling having two locking mechanisms to maintain a locking relationship between two coupling halves.

A further object of the invention is to provide an improved hose coupling having a helical restriction means to attach the hose to a coupling half.

A still further object of the invention is to provide an improved hose coupling with a static electricity dissipating gasket to allow static electricity dissipation from the hose nozzle throughout the hose and couplings to a ground at a sand source.

SUMMARY OF INVENTION

The present invention is an improved hose coupling which can be used to connect sections of sandblasting hose.

The improved coupling consists of two coupling halves wherein each half has a hollow body and is preferably constructed of a high impact plastic although it can be constructed of other non-metallic materials. The coupling half has two locking mechanisms in which to securely keep the halves in a locked relationship. The first mechanism is the primary locking means which, through rotational engagement of members of the coupling halves, there is formed a locking relationship. The second mechanism is a spring wire which engages both coupling halves and prevents the rotation of the halves out of the locked relationship.

The area of the coupling half where the hose is attached incorporates the use of both restriction and retention means. The restriction means is a helical rib on the inside diameter of the hollow coupling body which engages the outside diameter of the hose. The retention means are holes in the hollow coupling body adapted to receive screws which are the second feature to keep the hose in place once inserted in the coupling half body.

The hose coupling has disposed at the end where the coupling halves come together a gasket. The gasket is composed of a static electric conducting material. This gasket will allow the static electric built-up in the hose sections to travel through the gasket toward ground. This action will keep the static electric flow totally within the confines of the hose and coupling, leaving no place available for arcing or possible electric shock. The gasket material besides being static electrically conductive provides all the features of a traditional gasket and properly seals the coupling halves from leakage at their union.

DETAILED DESCRIPTION OF THE DRAWINGS

Figure 1:
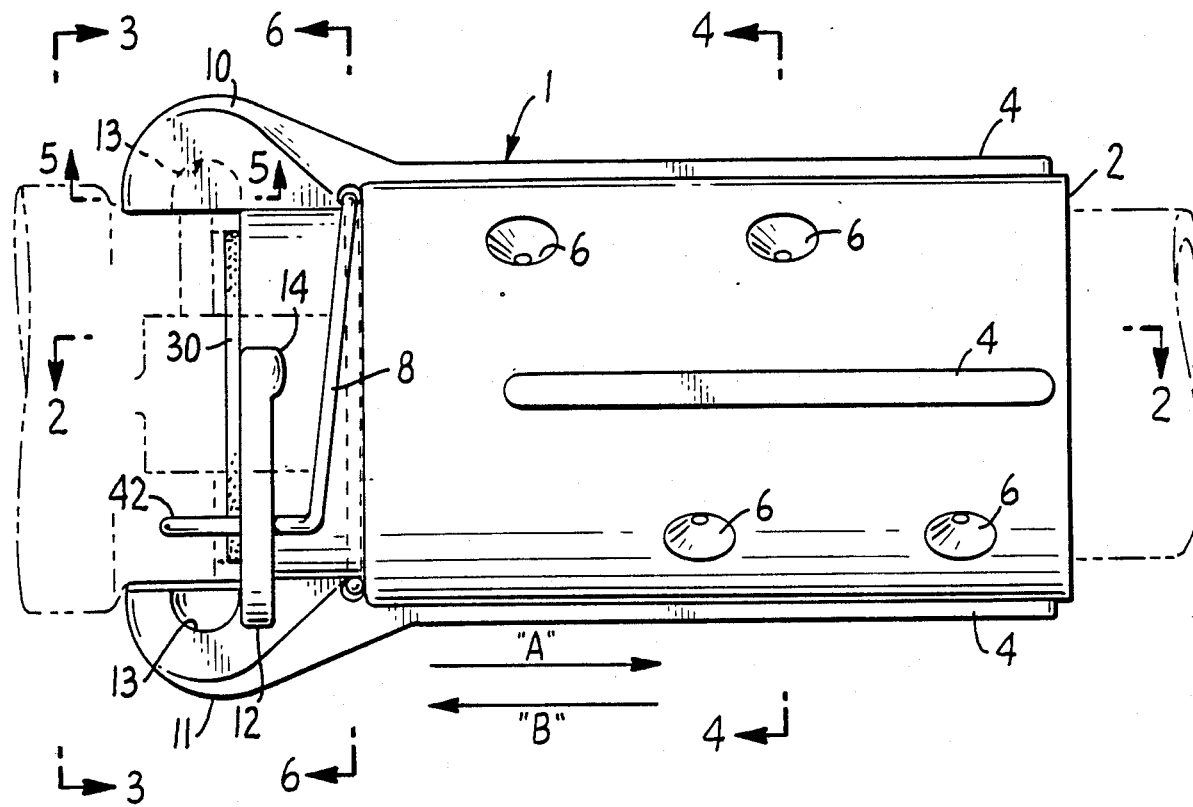
FIG. 1 is a side view of the improved hose coupling.

Referring to FIG. 1, the improved hose coupling half is generally shown at 1. The coupling half is designed to mate in a locking relationship with an identical coupling half to form the complete coupling. The disclosure that follows will describe the coupling half shown in FIGS. 1-6 but the disclosure has application to the complete coupling as a whole.

The coupling half 1 has a hollow body 2 preferably constructed of any insulative material such as a thermoplastic, for example, ST801 Y, commercially available from DuPont. Longitudinally disposed on the outside diameter of the body 2, are a plurality of ribs 4. In the preferred embodiment, there are four ribs equidistantly disposed on 2. The ribs 4 are so disposed to effect proper gripping of the coupling half.

The hollow body 2 also has disposed therein holes 6. There are a plurality of these holes disposed at various places in body 2. The holes are preferably frusto-conically shaped and extend from the outside to the inside diameter. The holes are designed to receive screws (not shown) that assist in holding the hose end in the coupling half thus constituting the retention means. In the preferred embodiment, there are two holes placed in the area between the ribs 4.

Figure 3:
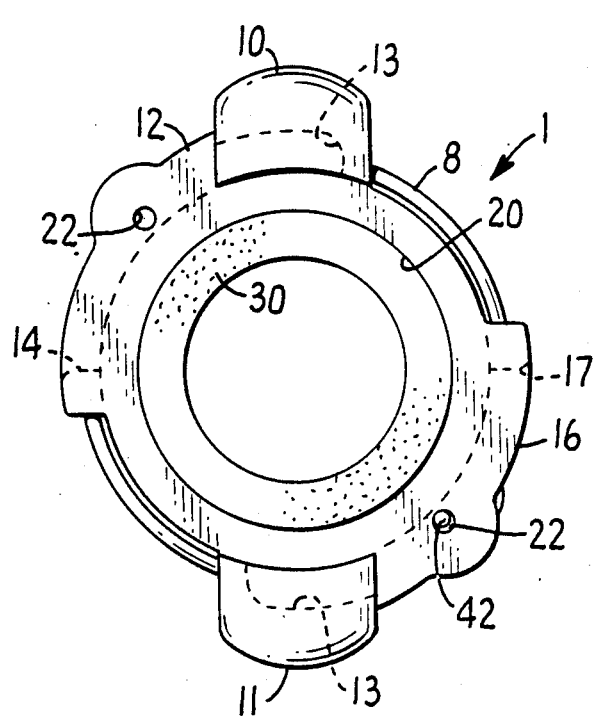
FIG. 3 is a view of the improved hose coupling at 3—3 of FIG. 1.
Figure 4:
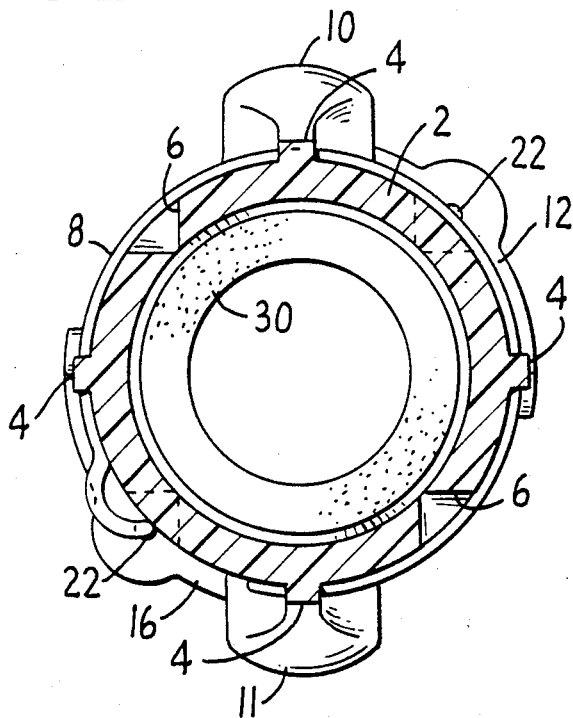
FIG. 4 is a view of the improved hose coupling at 4—4 of FIG. 1.

At the end of the coupling half that meets in a locking relationship with the second coupling half are the two locking mechanisms. The primary locking mechanism utilizes ears 10 and 11 and partially annular flange members 12 and 16 (FIG. 3). The ears 10 and 11 extend in an axial direction from the outside diameter of body 2.

The partially annular flange members 12 and 16 are disposed at the coupling end of hollow body 2. On the bottom side of flanges 12 and 16 are disposed raised members 14 and 17, respectively. When the coupling halves are in a locking relationship, flange members 12 and 16 of a first coupling half engage ears 10 and 11 of a second coupling half (and vice versa) and the raised members 14 and 17 of the flange members lock into ears 10 and 11, as will be described in full later.

Figure 2:
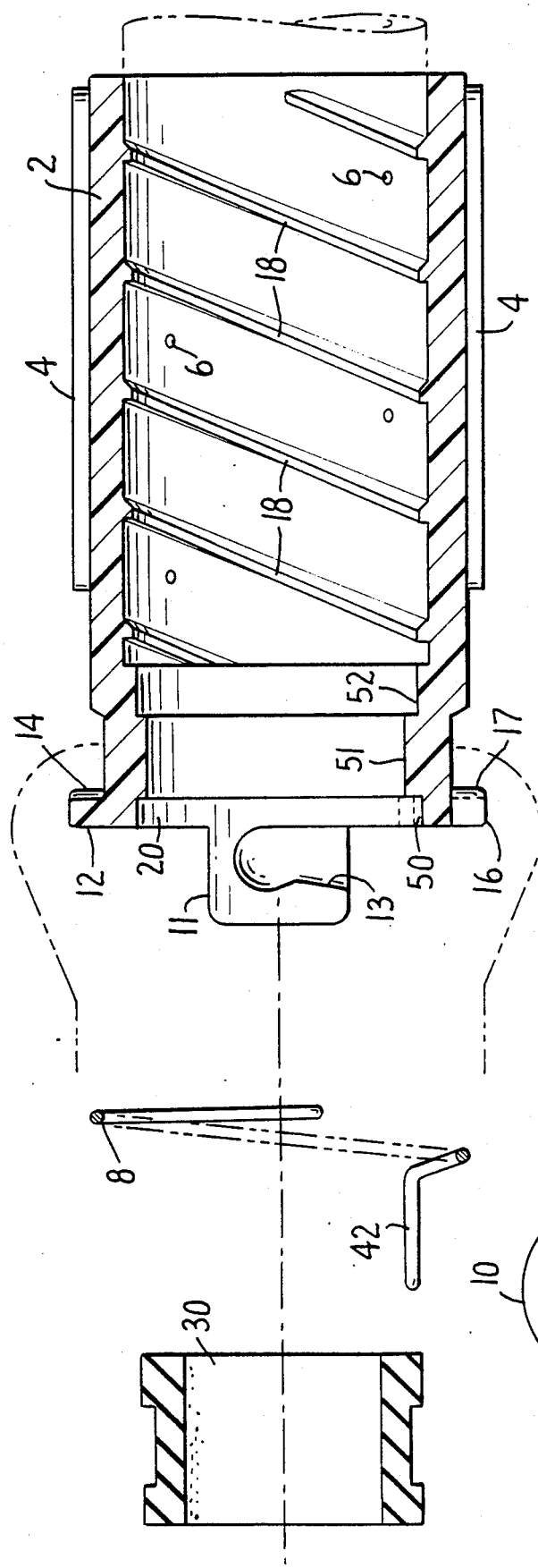
FIG. 2 is an exploded and cut-away view of the improved hose coupling.
Figure 5:
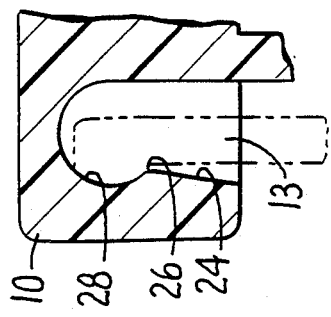
FIG. 5 is a view of an ear of the improved hose coupling at 5—5 of FIG. 1.

The second locking mechanism is preferably spring wire 8. The spring wire is secured to body 2 at the base of ears 10 and 11 and has end 42 which extends in an axial direction and passes through flange member 12 at hole 22. End 42 of spring wire 8 can be moved in direction "A" or "B" (FIG. 2). When the coupling halves are being locked together, end 42 will contact the flange surface of the second coupling half. End 42 will move in a direction "A" as the coupling halves are forced together and the end rides on the flange member. When the coupling halves are rotated so that raised members 14 and 17 lock into ears 10 and 11 of the other coupling half, end 42 reaches hole 22 in the flange member in which it is riding and rapidly moves in direction "B" through hole 22 to prevent rotation of the coupling halves out of their locked relationship. The uniting and separation of the coupling halves will be discussed in full later.

The coupling end of body 2 has therein disposed a set of annular grooves 20 (FIG. 2) and an electrically conductive gasket 30. Gasket 30 extends past the end of the body 2, so when the coupling halves are placed joined, the two gaskets will be pressed together in a sealing relationship. The gasket can be made of any suitable conductive material constructed in accordance with A STM D 2000-2AA-612-A13-B13-F17.

FIG. 2 shows an exploded and cut-away view of the improved hose coupling. The cut-away section discloses that portion of hollow body 2 remote from the coupling end showing the interior openings for holes 6. The inside diameter of the hollow body preferably has a helical rib 18, the pitch of which is such that, when viewed longitudinally along its cross-section the rib sections which are spaced apart along its substantial length. The helical pattern ceases when it reaches the annular grooves 20 at the coupling end of body 2.

The annular grooves have three sections 50, 51 and 52 (which is of essentially the same size as 50). The set of grooves 20 receives gasket 30 which has an outside diameter which has exterior (outside diameters) features conforming to the inside diameter features of the set of grooves allowing it to fit in an interlocking relationship with the grooves. The interlocking relationship of the grooves and gasket are such that the gasket has a slight degree of movement longitudinally to allow proper sealing at the union of the coupling halves and where the respective gaskets meets the hose end.

Referring to FIGS. 2-5, the uniting and separation of the coupling halves will be described. Each of the ears 10 and 11 have cut-out section 13. The cut-out sections of ears 10 and 11, as shown specifically in FIG. 5, have a wall with decline section 24, knob section 26 and recess section 28. These sections are adapted to receive raised portions 14 or 17 of flange members 12 or 16 in a ldcking relationship.

When the coupling halves are placed together, ears 10 and 11 are first placed in the area between ear 11 and flange 12 and ear 10 and flange 16 of the opposing coupling half. The coupling halves are rotated in opposite directions and the raised members 14 and 17 of flange members 12 and 16 contact the decline section 24 of ears 10 and 11 of the opposing coupling half. As the coupling halves are rotated, the decline section serves to cause the respective coupling halves to tighten together and provide a leakproof seal where the gaskets of the coupling halves meet. As the raised members reach knob section 26, the coupling halves are at their maximum tightness. As the rotation continues past the knob section, two events take place simultaneously. First, the raised members will snap into recess section 28 which will lock the coupling halves together. Second, end 42 of spring lock 8 will move in direction "B" (FIG. 1) and access hole 22 to prevent any rotation of the coupling halves out of their locked relationship.

To separate the coupling, end 42 of spring wire 8 must be manually moved in direction "A" (FIG. 1) to the extent that it no longer accesses hole 22 of the opposing coupling half. The coupling halves are then rotated in an opposite direction in a manner to cause raised members 14 and 17 to unseat from recess section 28 of ears 10 and 11 of opposing coupling halves. Once the raised members pass over knob section 26, they are easily rotated so that they can be separated.

Figure 6:
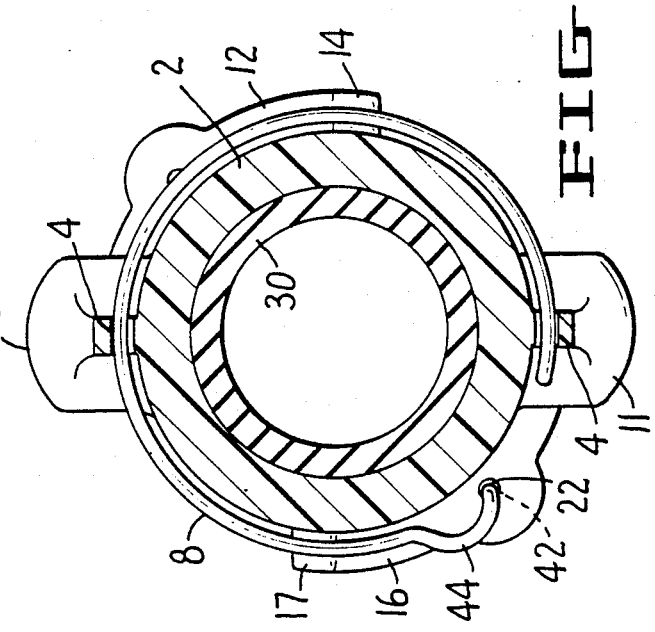
FIG. 6 is a view of the improved hose coupling at 6—6 of FIG. 1.

Referring to FIG. 6, a cross-sectional view at 6–6 of FIG. 1 is shown. The anchoring of spring wire 8 is provided where it passes through extentions of ribs 4 as they meet the base of ears 10 and 11, respectively. Also shown is section 44 of spring wire 8 which is used to manually withdraw end 42 from hole 22 when it is desired to separate the respective coupling halves.

In operation, the end of a section of the sandblast hose is screwed into the coupling half until it abuts the end of groove 52. Helical rib 18 serves as a restriction means to prevent the hose from coming out of the coupling half. As a safety measure, screws are placed in holes 6 to assist in holding the hose in place.

The coupling, when in use, allows for static electric dissipation within the confines of the hose and coupling. The static electricity in the hose and coupling flows up the hose from the nozzle to the sand source which is connected to ground. This provides a safe apparatus which eliminates arcing from the coupling which is a concern with metal coupling when in proximity of other metal objects.

When in operation, the hose and couplings serve as insulators to the outside diameter of the hose coupling so there is no access to ground through them. The static electricity in the hose flows to coupling gasket 30 where it is conducted to the next hose section. This action continues up the length of the hose section and couplings until the sand source is reached and static electricity can be grounded.

The invention contemplates all that is shown, described and claimed to be the invention herein and all equivalents thereto.

We claim:

1. A high impact hose coupling apparatus comprising:
   a hollow coupling body further comprising a hose retention means disposed at an outside diameter of the coupling body half, a hose restriction means disposed on an inside diameter surface of the hollow coupling body half, a plurality of partially annular flange surfaces extending radially outward at a first end of the coupling body half and each flange surface having a raised portion on at least one lateral surface, a plurality of ears disposed at the first end of the coupling body half which extend in an axial direction of the coupling body half having cut-outs to receive the flange surfaces with at least one raised portion of a flange of a second coupling body half in a locking relationship, an annular groove extending into the first end of the coupling body half;
   a spring locking means disposed at a first end of the coupling half body having a retractable portion extending through the flange surface for disposition in a second coupling body half preventing relative rotation between a first and second coupling body half in a locking relationship;
   a static electricity dissipating means disposed in the annular groove.

2. A high impact coupling apparatus comprising:
   a hollow coupling body further comprising a hose retention means, a hose restriction means on an inside diameter surface, a plurality of flange surfaces extending radially outward at a first end of the coupling half body, a raised portion of a lateral surface of each flange, a plurality of ears to engage the flange surfaces in a locking relationship disposed at a first end;
   a spring locking means disposed at a first end to prevent rotational displacement of two coupling halves when in a locking realtionship;
   a static electricity dissipating means disposed in an end of the coupling body half.

3. The coupling apparatus, as recited in claims 1 or 2, wherein the hose retention means are a plurality of holes in the hollow body capable of receiving screws in a screw/nut relationship to hold a hose disposed in the coupling body half.

4. The coupling apparatus, as recited in claims 1 or 2, wherein the hose restriction means is a raised helical rib disposed on the inside diameter of the body.

5. The coupling apparatus, as recited in claims 1 or 2, wherein the coupling body half is made of a high impact plastic.

6. The coupling apparatus, as recited in claims 1 or 2, wherein the static electricity dissipating means is a gasket.

7. The coupling apparatus, as recited in claims 1 or 2, wherein the coupling dissipates static electricity through the interior of the coupling body with a hose end disposed therein and through the inside diameter of the gasket.

* * * * *